United States Patent
Hsu et al.

(10) Patent No.: US 10,754,440 B2
(45) Date of Patent: Aug. 25, 2020

(54) TOUCH SENSITIVE KEYBOARD WITH FLEXIBLE INTERCONNECTIONS

(71) Applicant: Apple Inc., Cupertino, CA (US)

(72) Inventors: Yung-Yu Hsu, San Jose, CA (US); Mingjing Ha, Cupertino, CA (US); Zhiyuan Sun, Chicago, IL (US); Paul S. Drzaic, Morgan Hill, CA (US); Anuranjini Pragada, San Jose, CA (US); George Ho Yin Mak, Santa Clara, CA (US); Antonio Y. Layon Halun, Los Altos, CA (US); Wesley W. Zuber, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/147,384

(22) Filed: Sep. 28, 2018

(65) Prior Publication Data

US 2020/0103981 A1   Apr. 2, 2020

(51) Int. Cl.
*G06F 3/044* (2006.01)
*G06F 3/042* (2006.01)
(Continued)

(52) U.S. Cl.
CPC ......... *G06F 3/0202* (2013.01); *H01H 13/704* (2013.01); *H01H 13/7065* (2013.01);
(Continued)

(58) Field of Classification Search
CPC .......... G06F 1/16; G06F 1/1662; G06F 3/016; G06F 3/002; G06F 3/0202; G06F 3/0219;
(Continued)

(56) References Cited

U.S. PATENT DOCUMENTS 4,604,509 A * 8/1986 Clancy ................. H01H 13/702
200/513
4,712,092 A * 12/1987 Boldridge, Jr. ........ H01H 13/70
341/34

(Continued)

FOREIGN PATENT DOCUMENTS

JP   2000-163031 A   6/2000
JP   2002-342033 A   11/2002

OTHER PUBLICATIONS

Camacho, O. et al. (Jul. 2011). "Designing Touch Sensing Electrodes: Electrical Considerations and Recommended Layout," *Freescale Semiconductor, Inc.* Document No. AN3863, Rev. 4 (Jul. 2011), 28 pages.

(Continued)

*Primary Examiner* — Michael J Eurice
(74) *Attorney, Agent, or Firm* — Kubota & Basol LLP

(57) ABSTRACT

Touch sensitive mechanical keyboards and processes for detecting touch events and key depressions on the touch sensitive mechanical keyboard are provided. The touch sensitive mechanical keyboard can include a set of individually depressible mechanical keys having a touch sensitive surface. A touch sensor layer can be disposed on top of a key mechanism and flexible interconnections provided between key segments of the touch sensor layer can allow for depression of the key mechanism of individual keys. In some examples, the flexible interconnections can be formed by patterning a spring-like structure into the touch sensor layer. In some examples, the touch sensor layer can be transparent or include openings to allow a backlight to shine through. In some examples, addressable LED backlighting with buckling interconnects can also be provided to illuminate keycaps of the mechanical keyboard.

24 Claims, 13 Drawing Sheets

(51) Int. Cl.
*G06F 3/041* (2006.01)
*G06F 3/02* (2006.01)
*H03K 17/96* (2006.01)
*H01H 13/7065* (2006.01)
*H01H 13/704* (2006.01)
*G06F 1/16* (2006.01)

(52) U.S. Cl.
CPC .............. *H03K 17/96* (2013.01); *G06F 3/02* (2013.01); *G06F 3/041* (2013.01); *G06F 3/042* (2013.01); *G06F 3/044* (2013.01); *H03K 2017/9602* (2013.01)

(58) Field of Classification Search
CPC .... G06F 3/0224; G06F 3/0227; G06F 3/0304; G06F 3/0354; G06F 3/03547; G06F 3/041; G06F 3/0416; G06F 3/042; G06F 3/0421; G06F 3/044; G06F 3/045; G06F 21/83; G06F 2203/04111; G06F 2203/04106; H01H 3/122; H01H 11/0018; H01H 13/85; H01H 3/125; H01H 13/70; H01H 13/702; H01H 13/705; H01H 13/14; H01H 13/48; H01H 13/7006; H01H 13/7013; H01H 13/704; H01H 13/76; H01H 13/78; H01H 13/807; H01H 25/041; H01H 2003/0293; H01H 2221/002; H01H 2221/026; H01H 2223/003; H01H 2215/012; H01H 2215/004; H01H 2215/02; H01H 2215/05; H01H 2227/022; H01H 2235/018; H01L 25/16; H01L 2224/48227; H01L 2224/48247; H05K 3/4664; H05K 5/0013

See application file for complete search history.

(56) References Cited

U.S. PATENT DOCUMENTS

| | | | |
|---|---|---|---|
| 4,857,683 A * | 8/1989 | Maser | H01H 13/702 200/5 A |
| 4,857,684 A * | 8/1989 | Gratke | H03K 17/98 200/600 |
| 5,483,261 A | 1/1996 | Yasutake | |
| 5,488,204 A | 1/1996 | Mead et al. | |
| 5,825,352 A | 10/1998 | Bisset et al. | |
| 5,835,079 A | 11/1998 | Shieh | |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,690,387 B2 | 2/2004 | Zimmerman et al. | |
| 7,015,894 B2 | 3/2006 | Morohoshi | |
| 7,184,064 B2 | 2/2007 | Zimmerman et al. | |
| 7,663,607 B2 | 2/2010 | Hotelling et al. | |
| 7,978,181 B2 * | 7/2011 | Westerman | G06F 3/0219 178/17 C |
| 8,373,664 B2 | 2/2013 | Wright | |
| 8,479,122 B2 | 7/2013 | Hotelling et al. | |
| 9,148,142 B2 | 9/2015 | Hu | |
| 9,164,612 B2 | 10/2015 | Chae | |
| 9,229,600 B2 | 1/2016 | Schmid | |
| 10,372,246 B2 * | 8/2019 | Wang | C09D 5/24 |
| 2002/0171518 A1 * | 11/2002 | Hsu | H01H 59/0009 335/78 |
| 2003/0160712 A1 * | 8/2003 | Levy | H01H 13/702 341/22 |
| 2004/0090417 A1 * | 5/2004 | Amiri | G06F 3/0202 345/156 |
| 2004/0206615 A1 * | 10/2004 | Aisenbrey | H01H 13/702 200/262 |
| 2005/0104867 A1 * | 5/2005 | Westerman | G06F 3/0235 345/173 |
| 2005/0162389 A1 * | 7/2005 | Obermeyer | G05G 9/047 345/161 |
| 2005/0218397 A1 * | 10/2005 | Tran | B82Y 10/00 257/14 |
| 2005/0230822 A1 * | 10/2005 | Tran | G11C 13/02 257/735 |
| 2006/0152499 A1 * | 7/2006 | Roberts | G06F 3/0436 345/173 |
| 2006/0180450 A1 * | 8/2006 | Clark | G06F 3/0202 200/333 |
| 2006/0197753 A1 | 9/2006 | Hotelling | |
| 2007/0257821 A1 * | 11/2007 | Son | G06F 3/016 341/22 |
| 2008/0156624 A1 * | 7/2008 | Kim | H01H 59/0009 200/181 |
| 2009/0008234 A1 * | 1/2009 | Tolbert | H01H 13/702 200/600 |
| 2009/0058687 A1 * | 3/2009 | Rothkopf | G06F 3/03547 341/20 |
| 2009/0073127 A1 * | 3/2009 | Amiri | G06F 3/0202 345/168 |
| 2009/0251384 A1 * | 10/2009 | Ligtenberg | H01H 13/705 343/904 |
| 2010/0002402 A1 * | 1/2010 | Rogers | H01L 21/4867 361/749 |
| 2010/0148995 A1 * | 6/2010 | Elias | G06F 3/0202 341/22 |
| 2010/0149127 A1 * | 6/2010 | Fisher | G06F 3/0362 345/174 |
| 2011/0024275 A1 * | 2/2011 | Aisenbrey | B29C 45/0013 200/262 |
| 2011/0203912 A1 * | 8/2011 | Niu | H01H 3/125 200/341 |
| 2011/0298718 A1 | 12/2011 | Chang et al. | |
| 2012/0043191 A1 * | 2/2012 | Kessler | H01H 3/125 200/5 A |
| 2012/0092279 A1 * | 4/2012 | Martin | G02B 26/0833 345/173 |
| 2012/0092293 A1 * | 4/2012 | Ganapathi | G02B 26/0833 345/174 |
| 2012/0099264 A1 * | 4/2012 | Degner | G06F 1/1616 361/679.09 |
| 2012/0255762 A1 * | 10/2012 | Katagiri | B22F 1/0025 174/126.1 |
| 2012/0299175 A1 * | 11/2012 | Tran | B82Y 10/00 257/712 |
| 2013/0038578 A1 * | 2/2013 | Liang | G06F 3/03547 345/175 |
| 2014/0139455 A1 * | 5/2014 | Argiro | A63F 13/02 345/173 |
| 2014/0168100 A1 * | 6/2014 | Argiro | G06F 3/0416 345/173 |
| 2015/0090573 A1 * | 4/2015 | Mansky | H03K 17/9618 200/5 R |
| 2015/0185911 A1 * | 7/2015 | Kim | G06F 3/044 349/12 |
| 2016/0030835 A1 * | 2/2016 | Argiro | A63F 13/02 463/33 |
| 2017/0351341 A1 * | 12/2017 | Norwalk | G06F 3/021 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures" CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger identification, and Chordic Manipulation on a Multi-Touch Surface," A

(56) References Cited

OTHER PUBLICATIONS

Dissertation Submitted to the Faculty of the University of Delaware in Partial Fulfillment of the Requirements for the Degree of Doctor of Philosophy in Electrical Engineering, 364 pages.

* cited by examiner

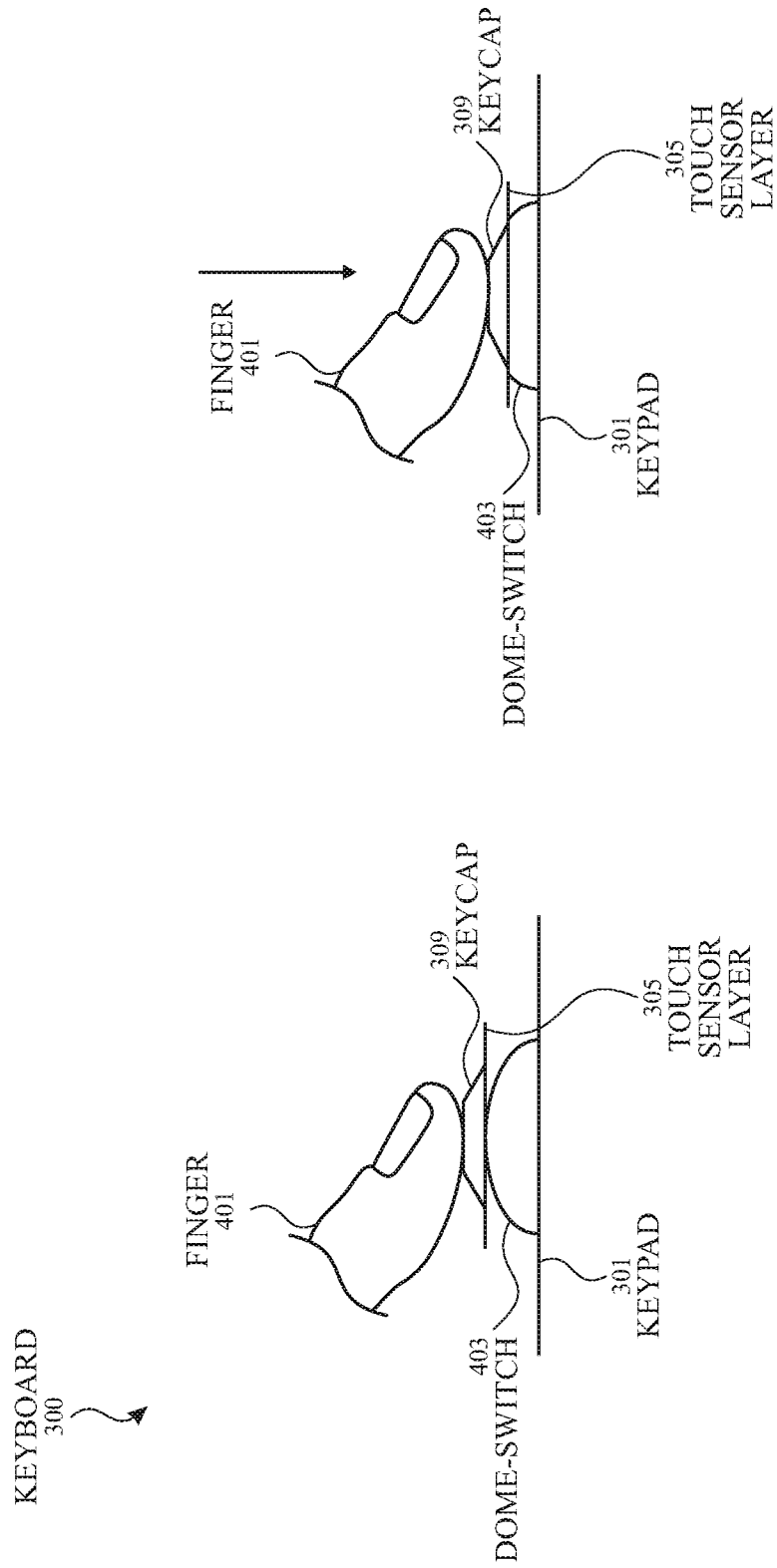

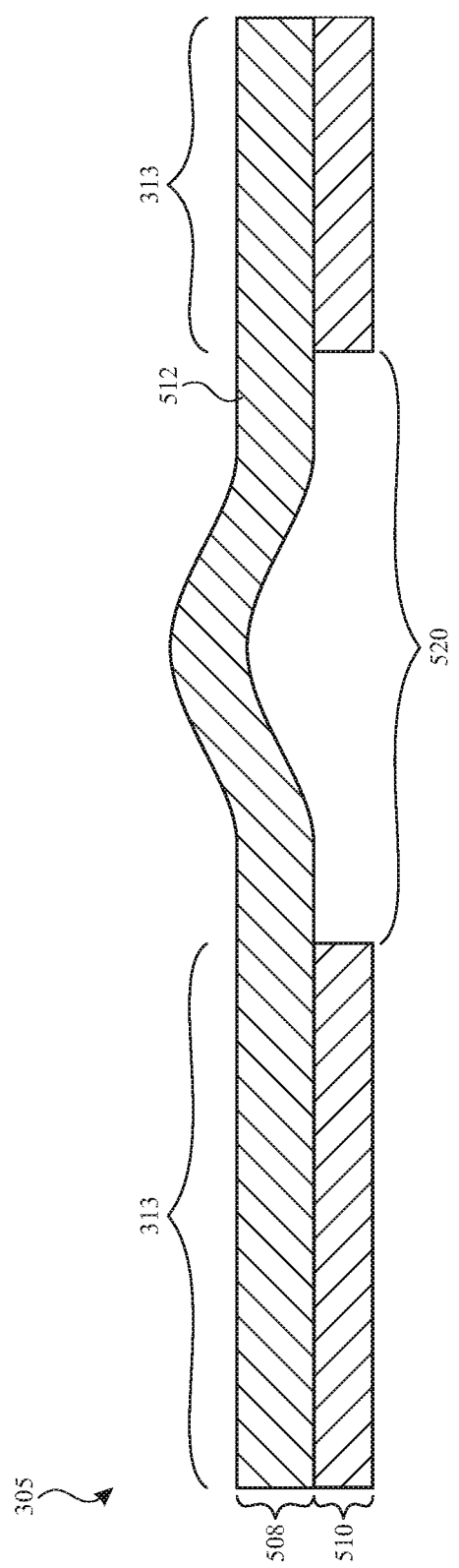

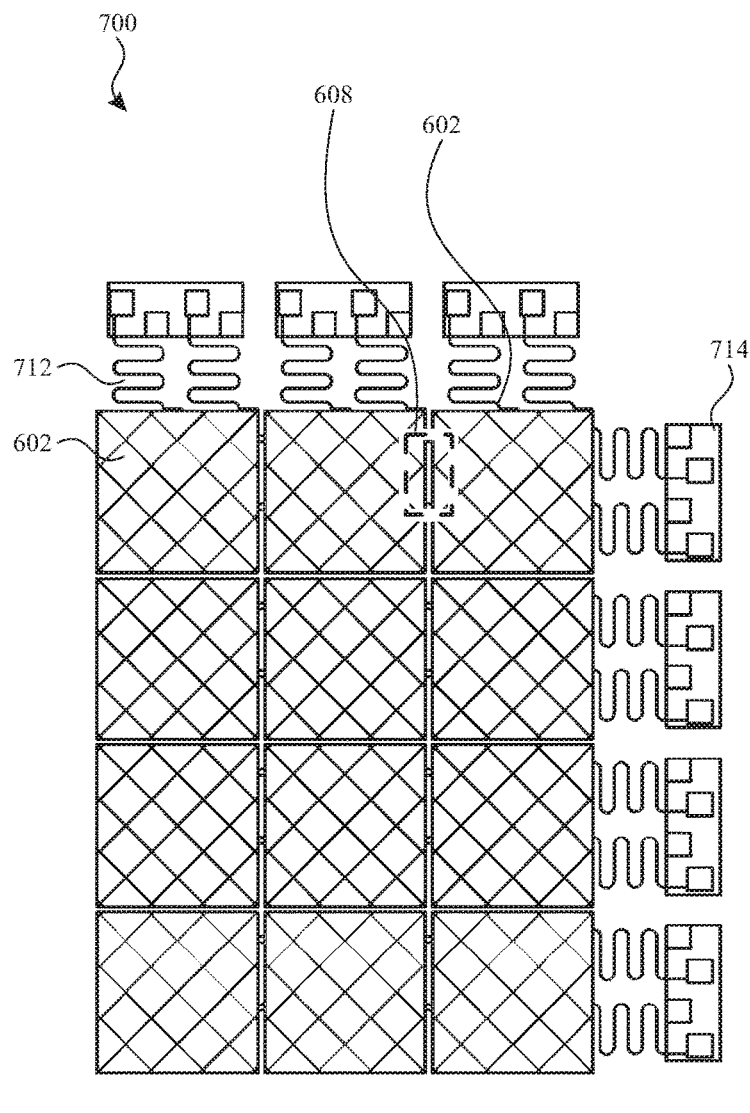
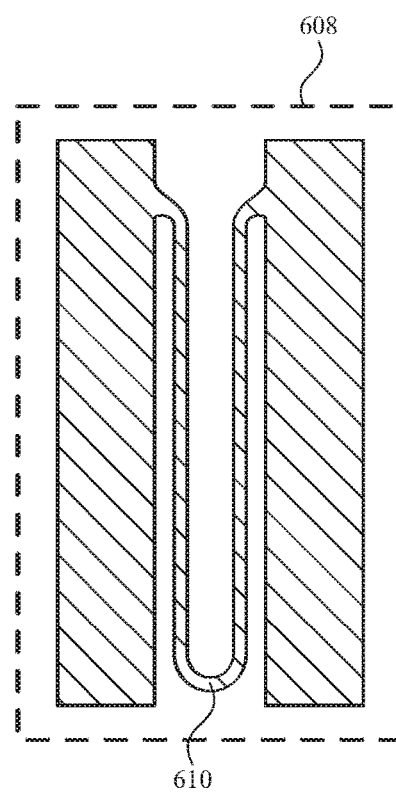
FIG. 7A
FIG. 7B

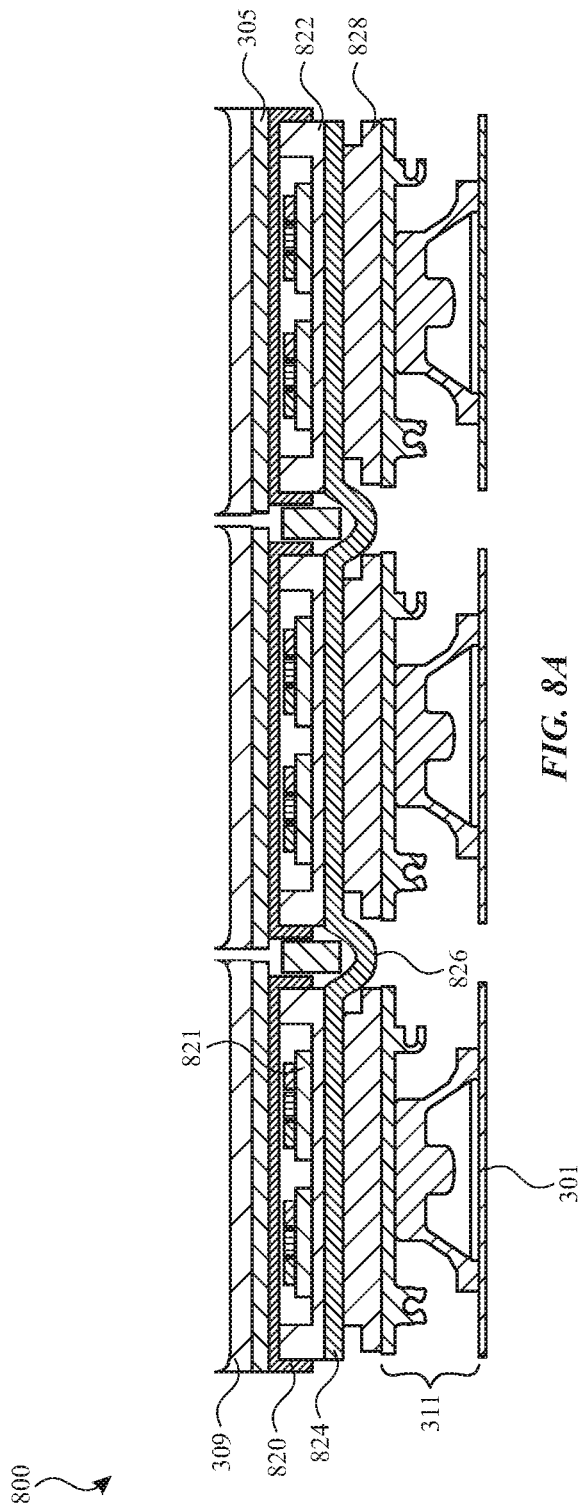
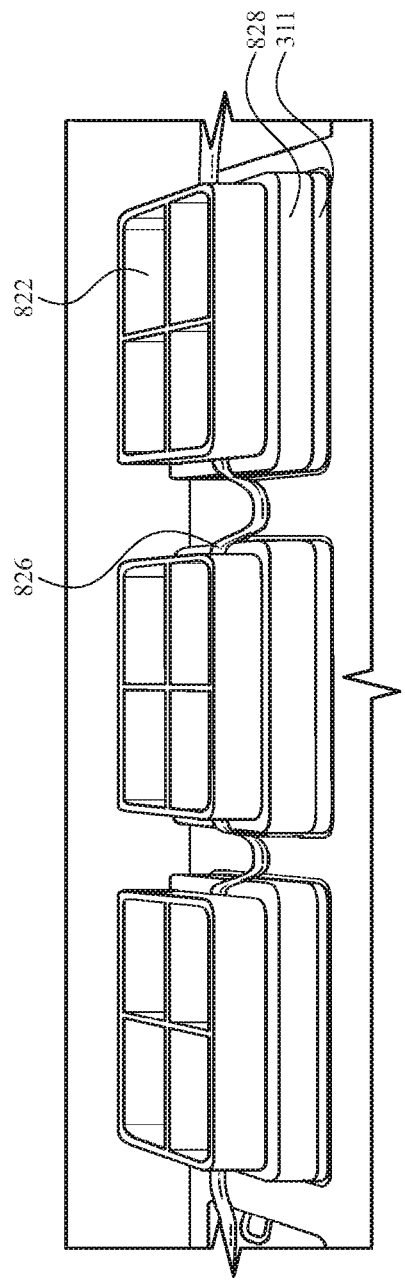
FIG. 8A
FIG. 8B

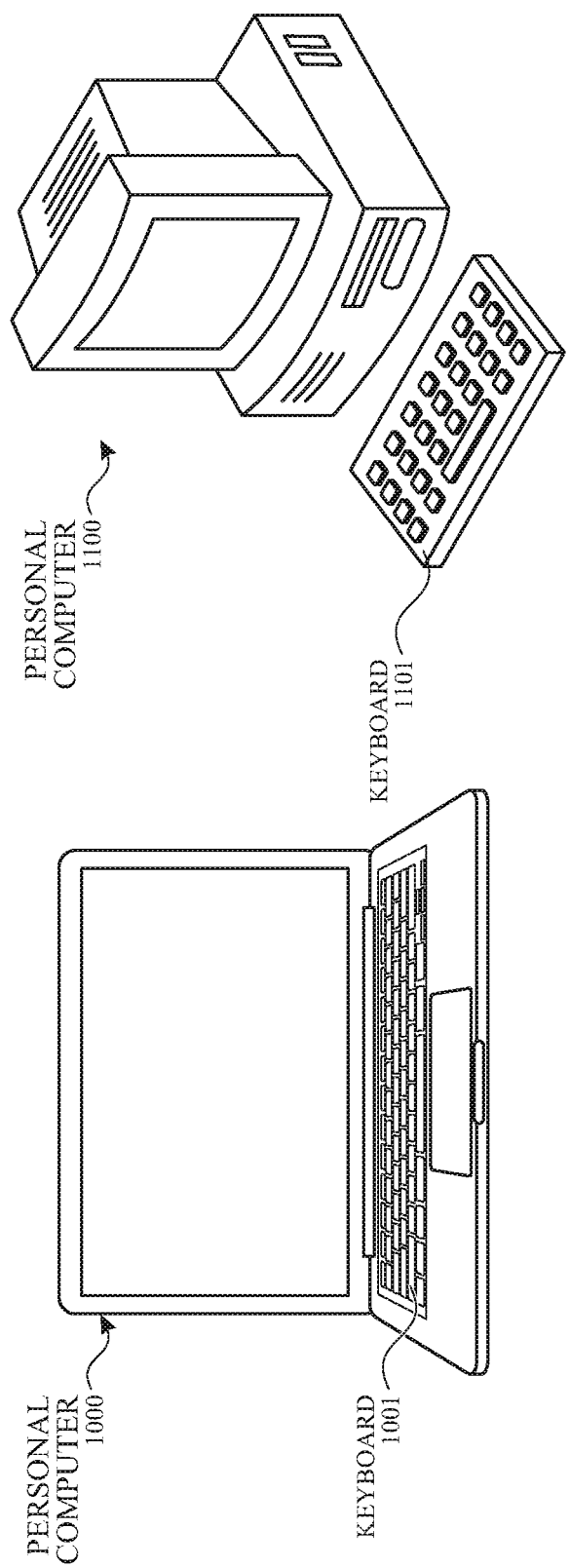

TOUCH SENSITIVE KEYBOARD WITH FLEXIBLE INTERCONNECTIONS

FIELD OF THE DISCLOSURE

This relates generally to input devices and, more specifically, to touch-sensitive input devices.

BACKGROUND

Keyboards are widely used and are generally accepted as the preferred way to provide textual input to a computing system. These keyboards typically have mechanical keys that are arranged in the so-called QWERTY layout and are configured to move independently of one another and comply with standards for key spacing and actuation force.

One of the most common keyboard types is a "dome-switch" keyboard that works as follows. When a key is depressed, the key pushes down on a rubber dome or mechanical switch sitting beneath the key. The rubber dome collapses, giving tactile feedback to the user depressing the key, and causes a conductive contact on the underside of the dome to touch a pair of conductive lines on a Printed Circuit Board (PCB) below the dome, thereby closing the switch. A chip in the keyboard emits a scanning signal along the pairs of lines on the PCB to all the keys. When the signal in one pair of the lines changes due to the contact, the chip generates a code corresponding to the key connected to that pair of lines. This code is sent to the computer either through a keyboard cable or over a wireless connection where it is received and decoded into the appropriate key. The computer then decides what to do on the basis of the key depressed, such as display a character on the screen or perform some action. Other types of keyboards operate in a similar manner, with the main differences being how the individual key switches work. Some examples of other keyboards include capacitive-switch keyboards, mechanical-switch keyboards, Hall-effect keyboards, membrane keyboards, roll-up keyboards, and the like.

There have been numerous attempts made to introduce an alternative to the standard keyboard. The changes include, but are not limited to, non-QWERTY layouts, concave and convex surfaces, capacitive keys, split designs, membrane keys, etc. However, while such alternative keyboards may provide improved usability or ergonomics, they have failed to replace or duplicate the commercial success of the conventional mechanical keyboard.

SUMMARY

This relates to touch sensitive mechanical keyboards and processes for detecting touch events and key depressions on the touch sensitive mechanical keyboard. The touch sensitive mechanical keyboard can include a set of individually depressible mechanical keys having a touch sensitive area located on their surface. A touch sensor can be included within the keyboard to detect touch events on the surface of the mechanical keys. A keypad can also be included within the keyboard to detect a depression of one or more of the mechanical keys. In some embodiments, the touch sensitive mechanical keyboard can include a processor for distinguishing detected touch events from detected key depressions. The processor can generate either a touch event command or a key depression command. These will be described in more detail below.

Processes for detecting touch events and key depressions are also disclosed.

BRIEF DESCRIPTION OF THE DRAWINGS

FIGS. 4A-4B illustrates an exemplary touch sensitive key configuration according to examples of the disclosure.

FIGS. 5B and 5C illustrate an exemplary stackup for exemplary touch layers with flexible interconnections according to examples of the disclosure.

FIGS. 7A and 7B illustrate an exemplary configuration of a twelve key array with flexible interconnections according to examples of the disclosure.

FIGS. 8A and 8B illustrate an exemplary stackup for a touch sensitive keyboard with key backlighting according to examples of the disclosure.

FIG. 10 illustrates an exemplary personal computer including an input device according to various embodiments.

FIG. 11 illustrates another exemplary personal computer including an input device according to various embodiments.

DETAILED DESCRIPTION

In the following description of example embodiments, reference is made to the accompanying drawings in which it is shown by way of illustration specific embodiments that can be practiced. It is to be understood that other embodiments can be used and structural changes can be made without departing from the scope of the various embodiments.

This relates to touch sensitive mechanical keyboards and processes for detecting touch events and key depressions on the touch sensitive mechanical keyboard. A touch event, such as a tap or a slide, may be detected when a finger or other object is placed near or in contact with a touch sensitive surface followed by a slide or when a finger or other object is placed near or in contact with the touch sensitive surface followed closely in time with a lift of the finger or object (tap). The touch sensitive mechanical keyboard can include a set of individually depressible mechanical keys having a touch sensitive area located on their surface. A touch sensor can be included within the keyboard to detect touch events on the surface of the mechanical keys. A keypad can also be included within the keyboard to detect a depression of one or more of the mechanical keys. In some embodiments, the touch sensitive mechanical keyboard can include a processor for distinguishing detected touch events from detected key depressions. The processor can generate either a touch event command or a key depression command. These will be described in more detail below. The touch sensitive mechanical keyboard can advantageously allow users to enter textual input using a device having the same look and feel of a conventional keyboard while allowing the users to enter touch events without requiring the users to remove their hands from the keyboard. Processes for detecting touch events and key depressions are also disclosed. Although various examples of the disclosure describe detecting touch events, it is to be understood that hover events can be detected as well.

Figure 1:
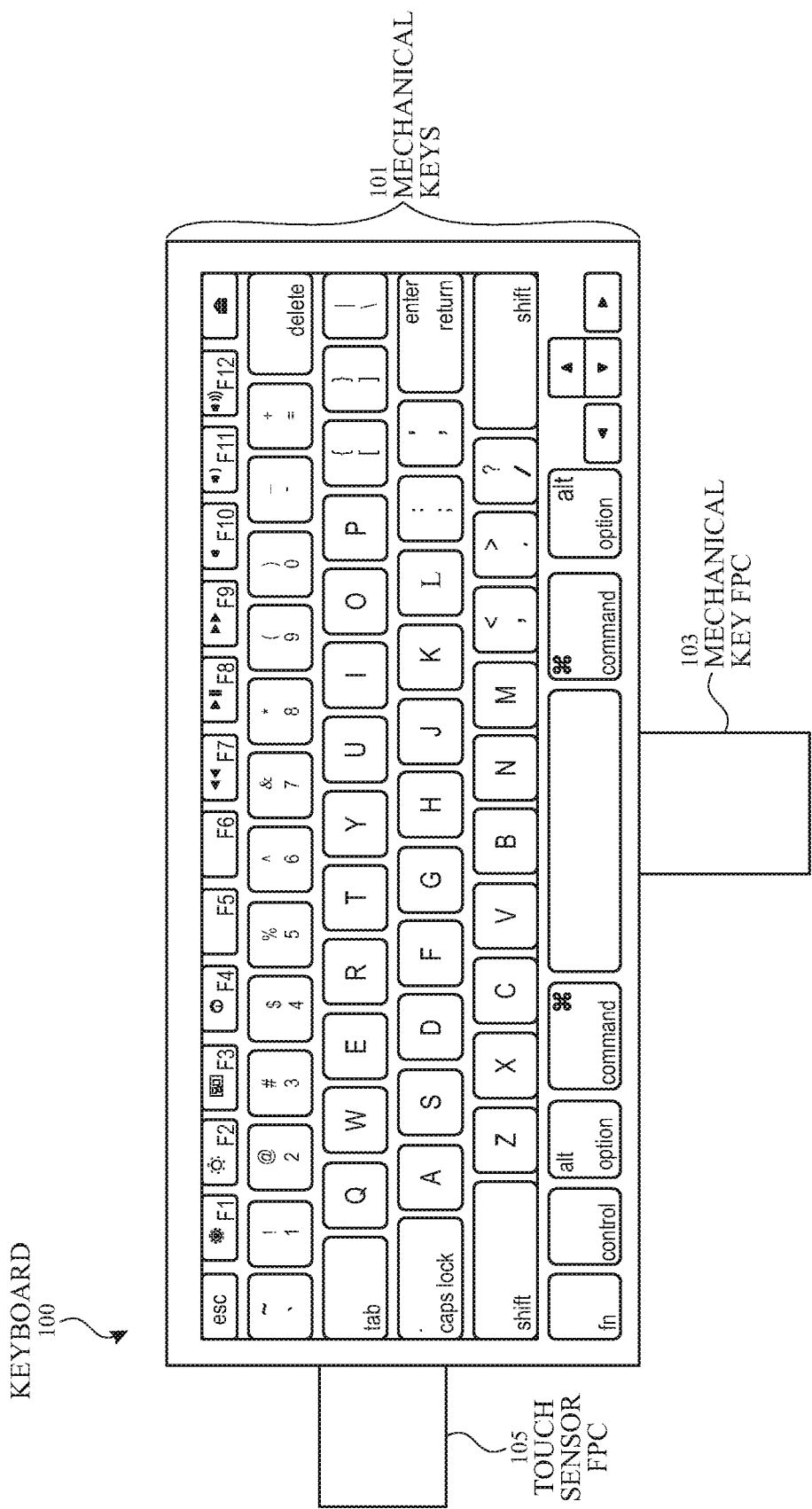
FIG. 1 illustrates a top view of an exemplary touch sensitive mechanical keyboard according to examples of the disclosure.

FIG. 1 illustrates an exemplary touch sensitive mechanical keyboard 100 having mechanical keys 101 and a touch sensitive area located on the surfaces of mechanical keys 101. In some embodiments, keyboard 100 can be configured to have the look and feel of a conventional keyboard. For instance, each mechanical key 101 can be individually depressible, giving the user of keyboard 100 tactile feedback associated with each depression of a key. Mechanical keys 101 can be used for text entry in a manner similar to a conventional keyboard. Additionally, the touch sensitive area of keyboard 100 can be used to detect touch events, such as taps or slides, on the surface of mechanical keys 101. In this way, keyboard 100 can also be used for cursor input functions, such as point, click, scroll, drag, select, zoom, and the like, without requiring the user to remove their hands from keyboard 100. These functions, and more, can be driven by hand/finger motion while the fingers are sliding over and touching mechanical keys 101.

In some embodiments, the touch sensitive area of keyboard 100 can include the surfaces of all mechanical keys 101. In other embodiments, the touch sensitive area can include the surfaces of only a portion of mechanical keys 101. By integrating multi-touch input capability into keyboard 100 without altering its overall appearance or, more importantly, the familiar way in which it is used for typing, many of the benefits of multi-touch gesture-based input capability can be realized without having any negative impact on the user's text entry experience.

In some embodiments, keyboard 100 can further include a mechanical key FPC 103 and a touch sensor FPC 105 from keyboard 100 to a processor or host computer system. For example, mechanical key FPC 103 can be used by keyboard 100 to output information relating to the depression of one or more of mechanical keys 101. Specifically, a signal indicating that one or more mechanical keys 101 have been depressed can be transmitted through mechanical key FPC 103 to a processor. Similarly, touch sensor FPC 105 can be used to output and receive information relating to a touch sensor included within keyboard 100. For example, in some embodiments, keyboard 100 can include a capacitive touch sensor having multiple drive lines and multiple sense lines. In these embodiments, a touch sensor FPC 105 can be used to receive stimulation signals for driving the drive lines and to transmit touch signals received on the sense lines.

While specific examples of touch sensitive mechanical keyboard 100 are provided above, it should be appreciated that the principals described in the present disclosure can similarly be applied to touch sensitive mechanical keyboards having other features and configurations.

Figure 2:
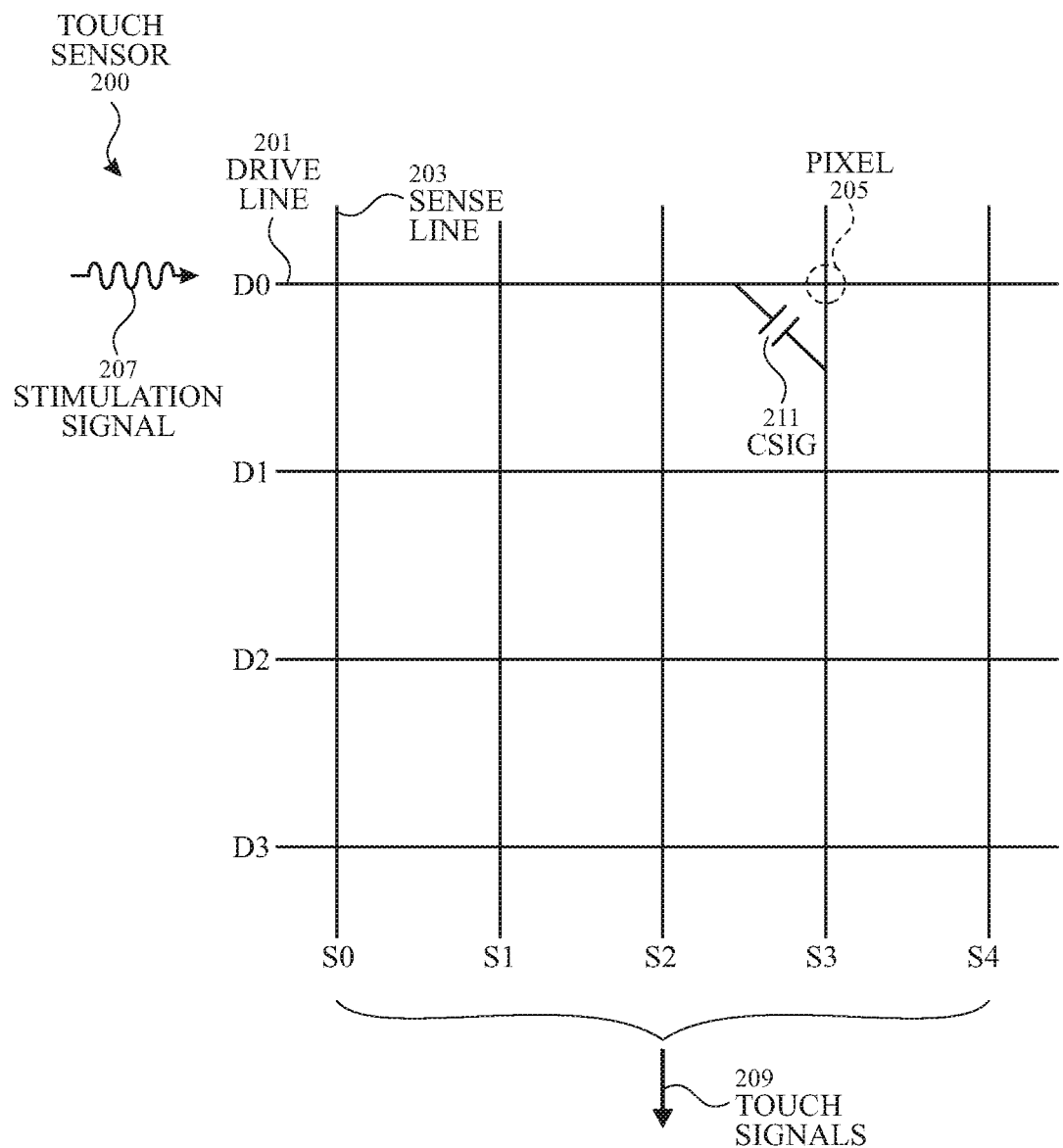
FIG. 2 illustrates an exemplary touch sensor panel that can be used with a touch sensitive mechanical keyboard according to examples of the disclosure.

FIG. 2 illustrates a portion of an exemplary touch sensor 200 that can be used to detect touch events on touch sensitive mechanical keyboard 100. Touch sensor 200 can include an array of pixels 205 that can be formed at the crossing points between rows of drive lines 201 (D0-D3) and columns of sense lines 203 (S0-S4). Each pixel 205 can have an associated mutual capacitance Csig 211 formed between the crossing drive lines 201 and sense lines 203 when the drive lines are stimulated. The drive lines 201 can be stimulated by stimulation signals 207 provided by drive circuitry (not shown) and can include an alternating current (AC) waveform. The sense lines 203 can transmit touch or sense signals 209 indicative of a touch at the panel 200 to sense circuitry (not shown), which can include a sense amplifier for each sense line.

To sense a touch at the touch sensor 200, drive lines 201 can be stimulated by the stimulation signals 207 to capacitively couple with the crossing sense lines 203, thereby forming a capacitive path for coupling charge from the drive lines 201 to the sense lines 203. The crossing sense lines 203 can output touch signals 209, representing the coupled charge or current. When a user's finger (or other object) touches the panel 200, the finger can cause the capacitance Csig 211 to reduce by an amount ΔCsig at the touch location. This capacitance change ΔCsig can be caused by charge or current from the stimulated drive line 201 being shunted through the touching finger to ground rather than being coupled to the crossing sense line 203 at the touch location. The touch signals 209 representative of the capacitance change ΔCsig can be transmitted by the sense lines 203 to the sense circuitry for processing. The touch signals 209 can indicate the pixel where the touch occurred and the amount of touch that occurred at that pixel location. As discussed above, in some embodiments, stimulation signals 207 and touch signals 209 can be received and transmitted via the touch sensor FPC 105.

While the embodiment shown in FIG. 2 includes four drive lines 201 and five sense lines 203, it should be appreciated that touch sensor 200 can include any number of drive lines 201 and any number of sense lines 203 to form the desired number and pattern of pixels 205. Additionally, while the drive lines 201 and sense lines 203 are shown in FIG. 2 in a crossing configuration, it should be appreciated that other configurations are also possible to form the desired pixel pattern. While FIG. 2 illustrates mutual capacitance touch sensing, other touch sensing technologies may also be used in conjunction with embodiments of the disclosure, such as self-capacitance touch sensing, resistive touch sensing, projection scan touch sensing, and the like. Furthermore, while various embodiments describe a sensed touch, it should be appreciated that the touch sensor 200 can also sense a hovering object and generate hover signals therefrom.

Figure 3A:
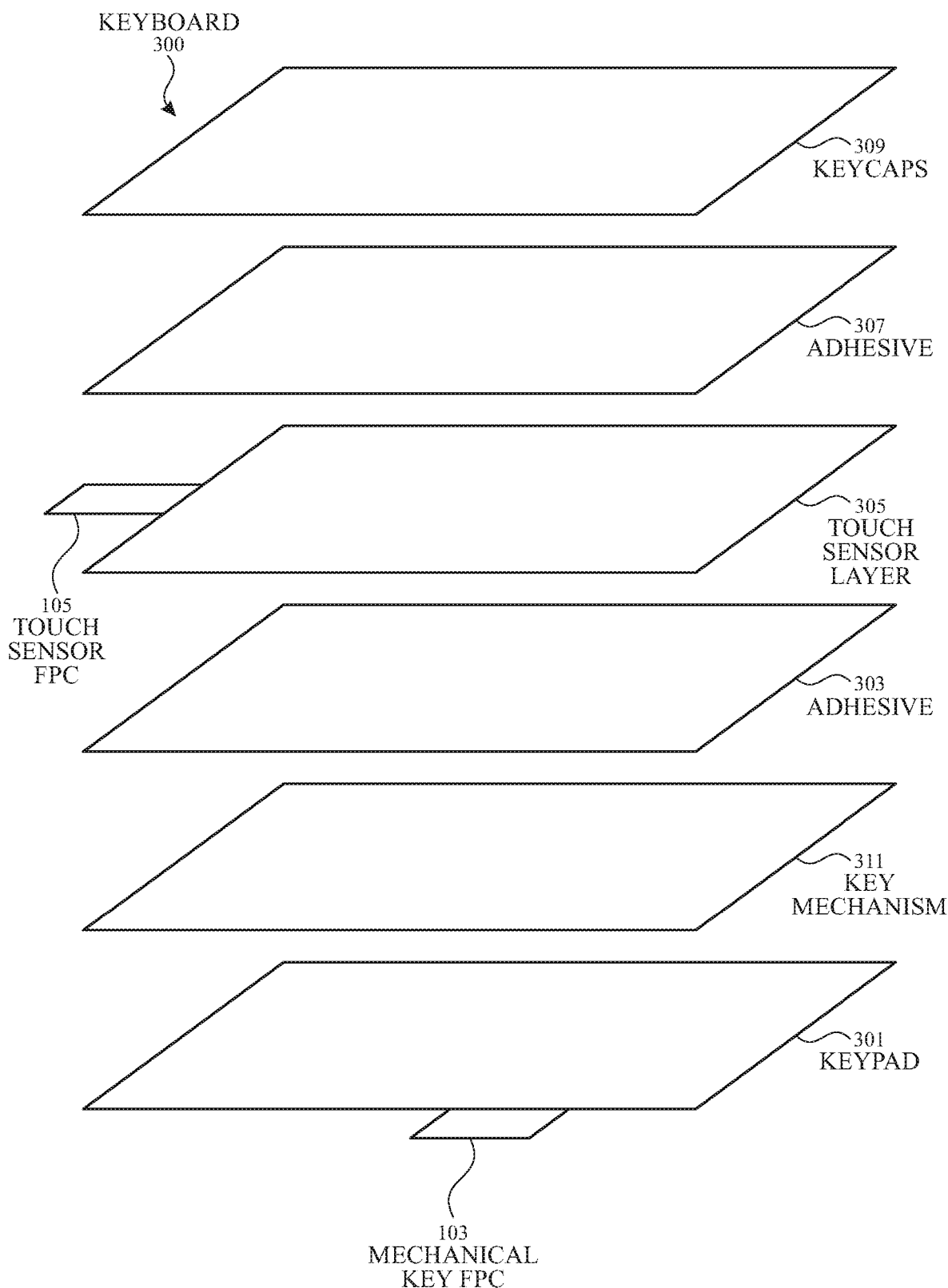
FIG. 3A illustrates an exploded view an exemplary touch sensitive mechanical keyboard according to examples of the disclosure.

FIG. 3A illustrates an exploded view of an exemplary touch sensitive mechanical keyboard 300. Touch sensitive mechanical keyboard 300 is an example of touch sensitive mechanical keyboard 100 and can include a touch sensor similar to touch sensor 200 for detecting touch events on the surface of some or all of the mechanical keys (not shown) of keyboard 300. Keyboard 300 can further include keypad 301 for detecting a depression of one or more of the mechanical keys of keyboard 300. In some embodiments, keypad 301 can include multiple dome-switches that are configured to couple pairs of conductive lines on a PCB below each dome to detect depression of one or more of the mechanical keys. Keyboard 300 can further include a processor (not shown) that emits a scanning signal along the pairs of lines on the PCB to all the keys. When the signal in one pair of the lines changes due to coupling by the dome-switch, the processor can generate a code corresponding to the key connected to that pair of lines. This information can be transmitted through mechanical key FPC 103 to a processor or computing device, such as a laptop computer, desktop computer, mobile device, mobile phone, or the like.

In other examples, keypad 301 can detect depression of mechanical keys using other technologies, such as capacitive-switch circuitry, mechanical-switch circuitry, Hall-effect sensors, and the like. It should be appreciated that any known method for detecting depression of mechanical keys can be used.

Keyboard 300 can further include a touch sensor layer 305 containing touch sensor circuitry for detecting touch events on the surface of the mechanical keys. Touch sensor layer 305 can be applied to a key mechanism 311 using an adhesive layer 303 (e.g., a pressure sensitive adhesive (PSA)). Touch sensor layer 305 can be located beneath keycaps 309, and can be applied to keycaps 309 using an adhesive layer 307 (e.g., a PSA). Keycaps 309 can include multiple discrete portions forming the front surface of the mechanical keys. The surface of keycaps 309 can include printed or engraved letters, symbols, or numbers. When depressed, the keycaps 309 can directly or indirectly contact the keypad 301 through touch sensor layer 305, causing keypad 301 to detect the depression of the mechanical keys.

In some embodiments, touch sensor layer 305 can include clusters of intersecting drive lines and sense lines forming sensor nodes similar to drive lines 201, sense lines 203, and pixels 205 of touch sensor 200 shown in FIG. 2. Each mechanical key can have associated therewith any number of sensor nodes depending on the desired touch resolution. For example, the drive lines and sense lines can form a grid beneath each keycap 309 to detect touch events along the surface of keycaps 309. To allow the depression of the mechanical keys to be detected by keypad 301, touch sensor layer 305 can be configured to allow force applied to keycaps 309 to directly or indirectly cause a contact with keypad 301. In some examples, the touch sensor layer 305 can be formed from a stretchable and/or flexible material to allow depression of the keys through touch sensor layer 305. In such examples, the touch sensor layer can stretch and/or flex when the keycap 309 is pressed, thereby allowing the key mechanism 311 to come in contact with the keypad 301. The present disclosure relates particularly to a configuration where a stretchable material can be used to allow the depression of the keys in such a configuration as will be understood from the disclosure below pertaining to FIGS. 4-10.

Touch sensor layer 305 can further include a touch sensor FPC 105 for outputting and receiving signals associated with the operation of touch sensor layer 305. For example, the touch sensor FPC 105 can be used to receive stimulation signals for driving the drive lines of touch sensor layer 305 and to transmit touch signals received on the sense lines of touch sensor layer 305. These signals can be transmitted to, and received from, a processor or other computing device, such as a laptop computer, desktop computer, and the like. In some embodiments, the processor coupled to touch sensor layer 305 can be the same processor coupled to keypad 301.

As discussed above, keyboards 100 and 300 can be capable of receiving both mechanical key depression input and touch event input. As a result, keyboards 100 and 300 can output two streams of information: a first data stream containing signals representative of a detected depression of one or more mechanical keys via mechanical key FPC 103 and a second data stream containing signals representative of one or more detected touch events via the touch sensor FPC 105. When a user contacts a surface of a mechanical key, touch sensor layer 305 can report a detected touch event. However, when a key is depressed, both touch sensor layer 305 and keypad 301 can report a detected event. Specifically, touch sensor layer 305 can report a detected touch event and keypad 301 can report a detected key depression.

Figure 3B:
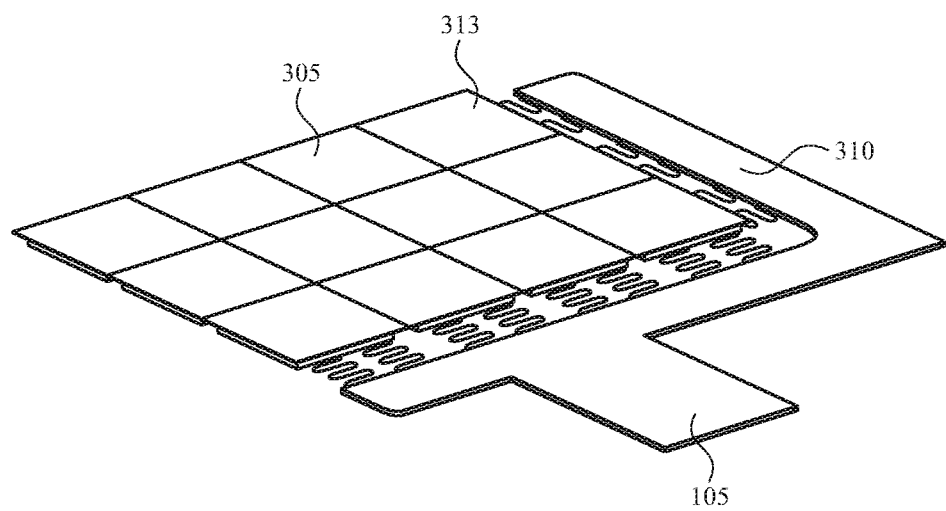
FIG. 3B illustrates a perspective view of an exemplary touch sensor layer that can be used in the exemplary touch sensitive mechanical keyboard according to examples of the disclosure.

FIG. 3B illustrates an exemplary configuration of a touch sensor layer 305, touch sensor FPC 105, and flexible interconnections 310 between the touch sensor layer 305 and touch sensor FPC 105 according to examples of the disclosure. As shown in the stackup of FIG. 3A, the touch sensor layer 305 can be overlaid onto a key mechanism (e.g., key mechanism 311), to provide touch sensing in addition key depression detection functionality in a keyboard. In some examples, the touch sensor layer 305 can be divided into key segments 313 that can each correspond to a mechanical key of a keyboard. In some examples, touch sensor electrodes (e.g., as described regarding FIG. 2 above and FIG. 6A below) can be disposed on the surface of the key segments 313 and flexible interconnections (as described regarding FIG. 6B below) can be disposed between the key segments to provide electrical connections between the key segments while also allowing depression of the key mechanism underlying the key segments. In some examples, flexible edge interconnections 310 can be connected between the touch sensor layer 305 and the touch sensor FPC 105. In some examples, the flexible edge interconnections 310 can comprise a spring-like trace that can be formed by processing the touch sensor layer to form conductors having a serpentine shape. As will be discussed in more detail below, the touch sensor layer 305 and flexible edge interconnections can be formed from multiple different materials with different characteristics as will be discussed in more detail with regard to FIGS. 5B-5C below.

FIG. 4A shows a user inputting a touch event by applying finger 401 to the surface of keycap 309 without exerting sufficient downward force to depress dome-switch 403. This action can cause the touch sensor, such as touch sensor layer 305, to detect the touch event and transmit a signal indicative of a detected touch event via touch sensor FPC 105 or 107. Since the dome-switch 403 is not depressed, the keypad may not transmit a signal indicative of a depression of mechanical key 101. Similarly, when a user enters a hover event by placing their finger near the surface of keycap 309, the touch sensor may transmit a signal indicative of a detected hover event via touch sensor FPC 105 or 107. Additionally, since the dome-switch 403 is not depressed, the keypad may not transmit a signal indicative of a depression of mechanical key 101.

FIG. 4B shows a user entering a key stroke by applying finger 401 to the surface of keycap 309 and exerting downward force sufficient to depress dome-switch 403. This action can cause dome-switch 403 to transmit a signal indicative of a depression of mechanical key 101 via mechanical key FPC 103. However, since the user's finger 401 also contacts keycap 309, the touch sensor, such as touch sensor layer 305, can detect the touch event and transmit a signal indicative of a detected touch event via touch sensor FPC 105.

Figure 5A:
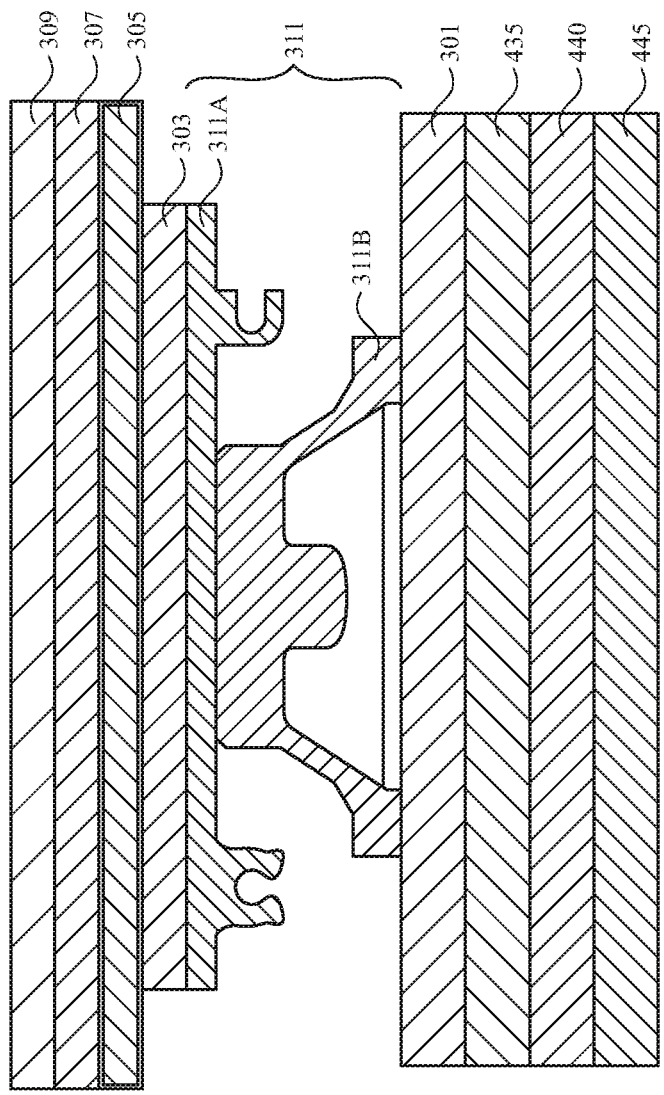
FIG. 5A illustrates an exemplary stackup for touch sensitive key according to examples of the disclosure.

FIG. 5A illustrates a cross-section of an exemplary stackup for a single mechanical key according to examples of the disclosure. FIG. 5A illustrates a keycap 309 bonded to a touch sensor layer 305 by an adhesive layer 307 (e.g., a PSA layer). The touch sensor layer 305 can in turn be bonded by an adhesive layer 303 (e.g., a PSA layer) to a key mechanism 311. In some examples, the key mechanism can include a rubber dome and a collapsible structure 311A such as a scissor mechanism or a butterfly structure engaged with the rubber dome 311B. In some examples, the collapsible structure 311A can transfer force from a user's press on the keycap 309 and cause the rubber dome 311B to deform and collapse. The rubber dome 311B of the key mechanism 311 can include a plunger that can contact keypad 301 when the key is sufficiently depressed. In some examples, contact between the rubber dome 311B and keypad 301 can cause an electrical connection to be made in the keypad that can be used to identify with key was pressed. In some examples, the keypad 301 can be coupled to an optional masking plate 435. In some examples, the masking plate can include a masking pattern for light emitted from an optional backlight 445 toward the keycaps 309. In some examples, the masking plate 435 can be coupled to a structural plate 440. In some examples, the structural plate can be a rigid plate that includes openings for allowing light from optional backlight 445 to pass through toward the backside of keycaps 309. In some examples, backlight 445 and masking plate 435 can be omitted, and the keypad 301 can be coupled directly to the structural plate 440. In some examples, the housing of the keyboard (e.g., keyboard 100 above) can act as the structural plate 440.

Figure 5B:
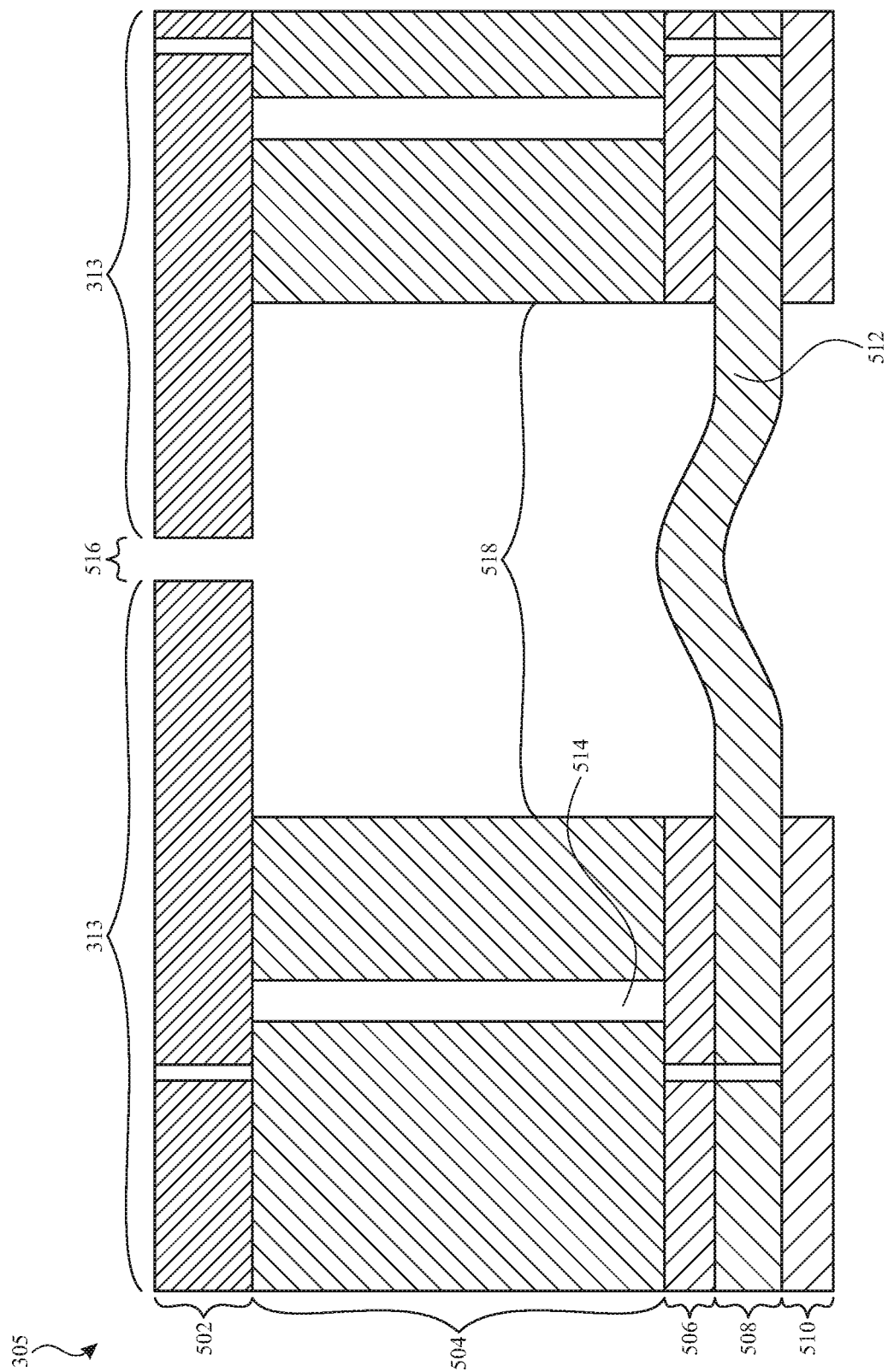

FIG. 5B illustrates a cross-section of exemplary touch sensor layer 305 configuration utilizing a rigid substrate with a flexible layer for forming interconnections according to examples of the disclosure. In the illustrated example, a portion of the touch sensor layer 305 near adjacent edges of two adjacent key segments 313 (e.g., corresponding to key segments 313 described with FIG. 3B above) is illustrated, as well as a flexible interconnection 512 between the key segments. In some examples, the main substrate 504 for the touch sensor layer 305 can be a conventional rigid printed circuit board (PCB) material (e.g., FR4 glass-reinforced epoxy laminate). In some examples, the main substrate 504 material can be used to provide a structural base to build the touch sensor layers upon. In some examples, the touch electrode layer 502 of the stackup can include touch sensor electrodes on metal traces disposed on either one or both sides of the touch electrode layer 502. In some examples, the size of the touch electrode layer 502 can be made equal to the size of the keycaps (e.g., 309 in FIG. 5A) that can be attached to the top of the touch electrode layer. In some examples, by making the touch electrode layer 502 equal to the size of the keycaps, the amount of touch sensitive area can be maximized while also being able to fully conceal the touch sensor layer 305 behind the keycap so that the touch sensor layer just not change the visual appearance of the keyboard (e.g., keyboard 100 or 300 above). In addition, in some examples, the gap 516 between the adjacent key segments 513 can be made small such that a user's finger sliding across the surface of several adjacent keys will not experience large discontinuities due to a large gap. In some examples, the spacing 516 between adjacent keycaps can preferably be between 100 microns and 1000 microns. In some examples, electrical signals for drive and sense electrodes on the touch sensor layer can be routed through vias 514 from the layers of the touch electrode layer 502, through the main substrate layer 504, and through a structural layer 506 to an interconnection layer 508. The interconnection layer can be used to provide routing traces between the touch sensor layer and the touch sensor FPC (e.g., 105 in FIGS. 3A-3B above. In particular, the flexible interconnection 512 shown in FIG. 5B can be used to provide routing of electrical signals from the touch sensor layer 305 to the touch sensor FPC 105 while also allowing individual keys to be depressed to allow detection of key depression by a user. In some examples, an optional structural layer 510 can be disposed between the interconnection layer 508 and a key mechanism (e.g., key mechanism 311) to provide structural support for the interconnection layer. In some examples, a large spacing 518 can be provided between the main substrate layers 514 of adjacent keycaps relative to the gap 516 provided between touch sensor layers 502 as illustrated in the figure. In some examples, the large spacing 518 can be provided so that the free length of the flexible interconnection 512 is relatively large even when the gap between keycaps can be relatively small. In some examples, the large spacing 518 can preferably be between 500 microns and 5000 microns. In some examples, a relatively large free length of the flexible interconnection can allow for less strain on the flexible interconnection when the mechanical key is depressed.

Figure 6B:
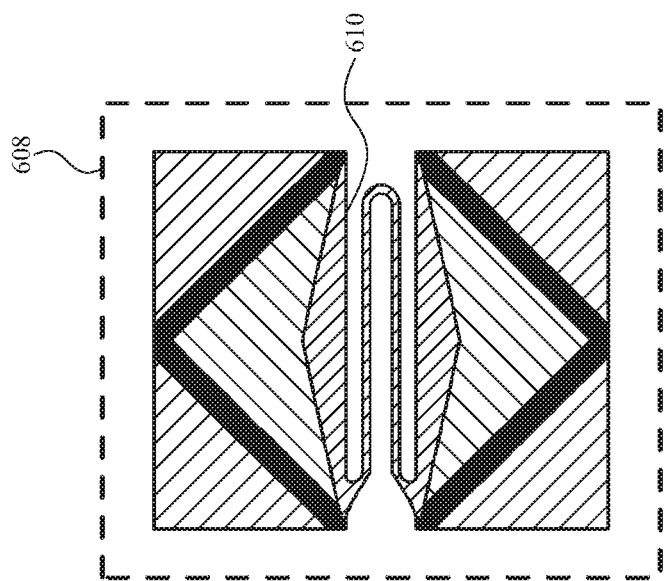
FIGS. 6A and 6B illustrate an exemplary touch sensor electrode configuration with flexible interconnections according to examples of the disclosure.
Figure 6A:
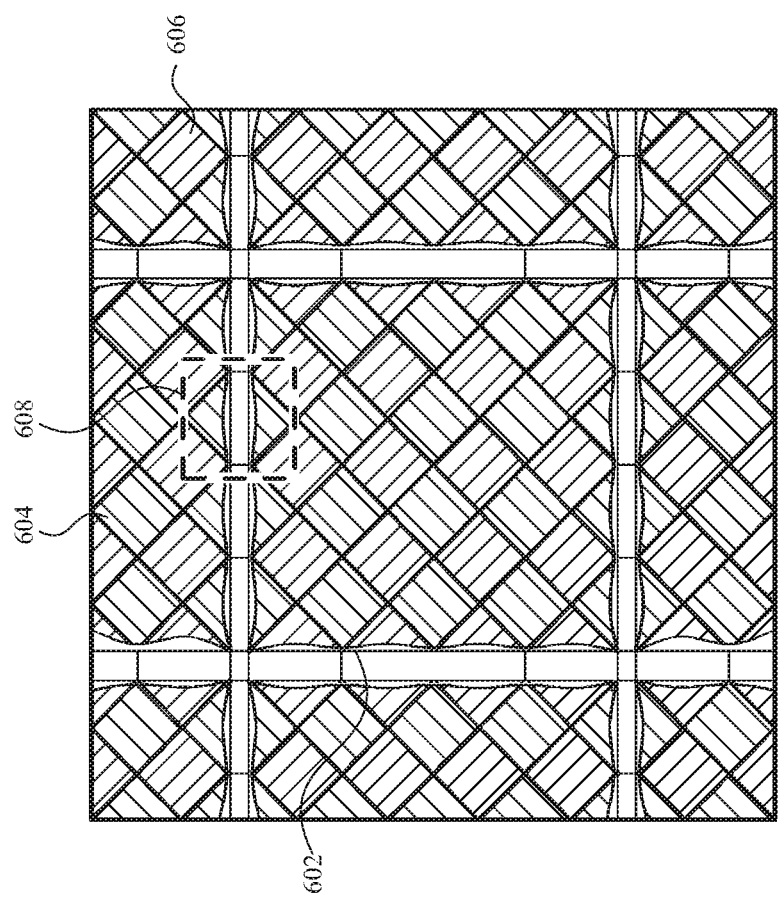

FIG. 5C illustrates an exemplary touch sensor layer 305 configuration utilizing a flexible substrate and flexible interconnections according to examples of the disclosure. Similar to FIG. 5B, in the illustrated example, a portion of the touch sensor layer 305 near adjacent edges of two adjacent key segments 313 (e.g., corresponding to key segments 313 described with FIG. 3B above) is illustrated, as well as a flexible interconnection 512 between the key segments. The structure of FIG. 5C differs generally from FIG. 5B by the omission of a rigid main substrate (e.g., 504 in FIG. 5B above) and a separate touch sensor layer 502. Instead, a single flexible substrate 508 can be used that includes a touch sensor electrode pattern (e.g., as illustrated in FIG. 6A below) directly on the flexible substrate. In some examples, a keycap (e.g., 309 in FIG. 5A) can be adhered directly to the flexible substrate 508. In some examples, flexible interconnection 512 can also be formed from the same flexible substrate 508. In particular, the flexible interconnection 512 shown in FIG. 5C can be used to provide routing of electrical signals from the touch sensor layer 305 to the touch sensor FPC (e.g., 105 in FIG. 3A above) while also allowing individual keys to be depressed to allow detection of key depression by a user. In some examples, an optional structural layer 510 can be disposed between the flexible substrate 508 layer and a key mechanism (e.g., key mechanism 311) to provide structural support for the flexible substrate. In some examples, the size of gap 520 between key segments 313 can be dictated by the spacing between keycaps (e.g., 309 in FIG. 5A above) that allows for smooth travel of a user's finger across the keycaps during touch input operations. Accordingly, in some examples, the spacing between keycaps 520 can preferably be between 100 microns and 1000 microns. In some examples, the size of gap 520 between key segments 313 can be dictated by providing sufficient free length of a spring-like flexible interconnection 512 to allow for depression of the underlying key without interfering with the feeling of key depression of the underlying key mechanism 311 for each individual key. Accordingly, in some examples, the spacing between keycaps 520 can preferably be between 500 microns and 5000 microns.

In some examples, the flexible substrate 508 can be made from an opaque material. In some example, the electrode pattern on the surface of the flexible substrate can be patterned from non-transparent conductors (e.g., copper). In some examples, flexible interconnections 512 can be formed by etching away portions of flexible substrate to form a spring-like structure. In some examples, flexible interconnections 512 can be formed by laser-cutting a spring-like structure into the flexible substrate material 508. In some examples, the flexible substrate 508 can be made from a transparent material (e.g., a transparent plastic material such as PET, polyimide, PVC, polycarbonate, etc.) and the electrode pattern on the surface of the flexible substrate can also be patterned from transparent conductors (e.g., carbon nanotubes, silver nanowire, etc.). In some examples, a serpentine spring-like pattern (e.g., as illustrated in FIGS. 6B, and 7A-7B) for flexible interconnections 512 can be relatively thin and long. Thus, in some examples, even when a transparent flexible substrate 508 and transparent touch sensor electrode conductors are used, a non-transparent conductor (e.g., silver ink) can be used for reducing resistance of routing traces disposed on the flexible interconnections 512. In some examples, the use of a transparent flexible substrate material 508 and transparent conductors for the touch sensor electrodes can allow for a backlight to shine through the touch sensor layer 305 and reach the backside of the keycaps (e.g., keycaps 309 in FIG. 5A). In addition, in some examples where an opaque material and/or non-transparent conductors are used, small openings can be included in the substrate and/or electrode pattern to allow backlighting to shine through the touch sensor layer 305 and reach the backside of the keycaps as well.

FIG. 6A illustrates an exemplary touch sensor electrode configuration that can be used for the touch sensor layer 305 of a touch sensitive keyboard according to examples of the disclosure. In then illustrated configuration, touch sensor electrode elements 604 and 608 can be disposed onto individual key regions 602, wherein each individual key region corresponds to an underlying mechanical key as described above. In between the key regions 602 there can be a gap that can contain a flexible interconnection 610 as will be described in further detail below with regard to FIG. 6B, which is a magnification of the outlined region 608 that shows a detailed view of interface between two adjacent key regions 602. In some examples, the electrodes 604 (indicated by hatch marks from bottom left to top right) can be connected vertically to form vertical lines (e.g., such as sense lines 203 in FIG. 2 above). Similarly, the electrodes 608 (indicated by hatch marks from top left to bottom right) can be connected horizontally to form horizontal lines (e.g., such as drive lines 201 in FIG. 2 above). In some examples, the vertical lines can act as drive lines (e.g., 201 above) and the horizontal lines can act as sense lines (e.g., 203 above). In some examples, the touch sensor electrode elements 604 and 608 can be conductive elements that are included in a single side of the substrate of the key regions 602. In some examples, a bridge conductor (not shown) can be disposed on a second layer of the touch sensor to provide routing at crossing points between vertical and horizontal routing lines. In some examples, the electrodes 604 can be disposed on a first side of the substrate of the key region 602, and the electrodes 608 can be disposed on a second side of the substrate of the key region 602. It should be understood that the key region 602 and flexible interconnection 610 can comprise any of the configurations described above with regard to FIGS. 5B and 5C (e.g., opaque, transparent, rigid with flexible interconnections, flexible with flexible interconnections, etc.) and any other examples disclosed herein.

FIG. 6B illustrates an exemplary flexible interconnection 610 that can be used for providing the electrical connections between key regions 602. As shown in the example, the flexible interconnection 610 can be a spring-like structure that is formed in the same plane as the rest of the touch sensor layer 305. The flexible interconnections 610 can provide the interconnections in the vertical and horizontal connections between key regions 602 to allow vertical and horizontal lines of electrodes to be continuous across the gaps between the key regions. In addition, the spring-like structure of the flexible interconnections 610 for a key that is depressed by a user can stretch and deflect to accommodate a key depression input. In some examples, the spring-like structure of the flexible interconnection can add a minimal amount of resistance to key depression of individual keys relative to the resistance of the underlying key mechanism (e.g., 311 above). In some examples, when the key depression input is completed, the spring-like structure of the flexible interconnections 610 can return to their original shape in the absence of a key depression input. In the illustrated configuration of the spring-like structure of flexible interconnection 610, a single loop is shown bridging the gap between two adjacent key regions 602. In some examples, multiple loops of the spring-like structure can be provided between the key regions 602. Furthermore, in some examples, the spring-like structure can be formed in a plane perpendicular to the plane of the rest of the touch sensor layer (not shown). It should be noted that the illustrations in FIGS. 5B and 5C above can represent a cross-section along a vertical line passing through the region 608 illustrated in FIG. 6B.

FIG. 7A illustrates an exemplary configuration for a twelve key touch sensitive keypad 700 that can include flexible interconnections according to examples of the disclosure. In the illustrated configuration of FIG. 7A, the twelve keys can be arranged in an array of four rows and three columns. In some examples, the illustrated example can correspond to a portion of a numeric keypad portion of a keyboard 100. In the illustrated configuration, touch sensor elements such as those illustrated in FIG. 6A can be disposed on key regions 602 for each of the twelve keys. In some examples, flexible edge interconnections 712 (e.g., corresponding to flexible edge interconnections 310 above) can be used to route electrical signals between key regions 602 and connection bars 714. In some examples, one connection bar can be provided for each column and row of the key array 700. In some examples, the connection bars can have conductive pads 714 that can be used to connect to a flexible printed circuit (e.g., 105 in FIG. 3B above). FIG. 7B illustrates a close up of the region 608 between two adjacent key regions 602. FIG. 7B provides another illustration of a flexible interconnection 610 that can utilize a spring-like trace to provide electrical connections between key regions 602 while also allowing for the depression of the underlying key during a key depression. It should be noted that the illustrations in FIGS. 5B and 5C above can represent a cross-section along a horizontal line passing through the region 608 illustrated in FIG. 7B.

In the examples of FIGS. 7A-7B, an exemplary twelve key touch sensitive keypad 700 has been shown to illustrate the principles of a touch sensor layer (e.g., 305 in FIGS. 3-6 above) with flexible interconnections (e.g., 610 in FIG. 6 above) according to examples of the disclosure. It should be understood that a similar configuration can be provided to an array of keys that has more or fewer keys than the touch sensitive keypad. In some examples, touch sensitivity using a touch sensor (e.g., 305 in FIGS. 3-6 above) can be added to every key of a keyboard, (e.g., keyboard 100 above). In some examples, touch sensitivity can be added to multiple sub-regions of keys of a keyboard. In some examples, a single touch sensor layer (e.g., 305 in FIG. 306 above) and a single touch sensor FPC 305 can be used for all touch sensing for any touch sensitive regions of the keyboard. In some examples, multiple touch sensor layers and/or multiple touch sensor FPC connectors can be provided to provide touch sensing for different sensitive regions of the keyboard. Furthermore, it should be understood that the key region 602 and flexible interconnections 610 can comprise any of the configurations described above with regard to FIGS. 5B and 5C (e.g., opaque, transparent, rigid with flexible interconnections, flexible with flexible interconnections, etc.) and any other examples disclosed herein.

FIG. 8A illustrates an exemplary configuration for a touch sensitive keyboard 800 with addressable light emitting diode (LED) backlighting according to examples of the disclosure. In the illustration of FIG. 8A, keycaps 309 and touch sensor panel 305 can correspond to the keycaps and touch sensor panels described throughout the various examples of the disclosure above. In some examples, the touch sensor panel can be a transparent touch sensor panel with flexible interconnections a described for various examples above with regard to FIG. 5C above. In some examples, the transparent touch sensor panel 305 can allow light transmitted by addressable LEDs 821 to illuminate the backside of the keycaps 309. In some examples, the keycaps 309 can be partially transparent or translucent such that light illuminating the backside of the keycaps can shine through the transparent or translucent portions of the keycap. In some examples, the transparent or translucent portions of the keycap can include one or more symbols representing key functionality (e.g., the letter "a" or the number "7"). In some examples, a single keycap 309 can include multiple symbols that can be separately illuminated by multiple addressable LEDs 821 per key. In some examples, rather than being adhered to a key mechanism 311 (e.g., as shown in FIG. 5A above), the touch sensor panel can be adhered to a backing plate 820. In some examples, the backing plate 820 can be made from a transparent material that allows light from LEDs 821 to pass through and illuminate the back side of keycaps 309. In some examples, the backing plate 820 can have window cutouts that allow light from LEDs 821 to pass through and illuminate the back side of key caps 309. In some examples, the backing plate 820 can sit atop optional secondary optics 822. In some examples, the secondary optics (shown in further detail in FIG. 8B) can provide light shielding between multiple LEDs 821 per key to direct light from the LEDs toward the backside of the keycap 309 and prevent light bleed toward edges of the keycap as well as directing light from each addressable LED 821 to a particular portion of the key. In some examples, the addressable LEDs 821 can receive electrical signals for controlling the color and brightness of each individually LED on LED signal layer 824. In some examples, the LED signal layer 824 can include routing traces that route electrical connections between the LEDs 821 and control and driving circuitry (not shown). The LED signal layer 824 can also include flexible interconnections 826 that can be used to route electrical connections for the LEDs 821 while also allowing movement of the individual key when a key depression occurs. In the illustrated example, the flexible interconnections 826 can be buckles that extend perpendicularly relative to the plane of the LED signal layer 824. In some examples, the LED signal layer 824 can be disposed on a mechanical layer 828 that can include notches or channels that provide space to allow the buckle shaped flexible interconnections 826 to deform when the key is depressed. In some examples, the mechanical layer 828 can be coupled to a key mechanism 311 (which can correspond to key mechanism 311 described above with regard to FIGS. 3A and 5A above. In some examples, the key mechanism can be disposed on a keypad 301 (e.g., keypad 301 in FIG. 3A above) that can be used to detect key depressions of the keys.

FIG. 8B illustrates a perspective view of an exemplary secondary optics 822, mechanical layer 828, flexible interconnections 828 and an upper portion of a key mechanism 311 according to examples of the disclosure. As illustrated, the secondary optics 822 can be comprised of an opaque material that can prevent bleeding of light from the LEDs and focus the light transmission toward specific regions of the backside of keycaps 309 in FIG. 8A. In the illustrated example, the secondary optics includes dividers that can divide the secondary optics into a plurality of chambers, (e.g., the chambers forming four quadrants in FIG. 8B). In some examples, the number of chambers can correspond to the number of LEDs 821 attached to the LED signal layer (e.g., 824 in FIG. 8A above) and each LED can be positioned within the boundaries of a different chamber from the other LEDs. In such an example, the four LEDs can be used to address and illuminate four distinct regions on the backside of keycap 309. The LED signal layer can sit atop the mechanical layer 828 and underneath the secondary optics 822 as shown in FIG. 8A. In some examples, the secondary optics may include no dividers. Furthermore, the number of LEDs 821 does not necessarily have to be equal to the number of chambers provided by the secondary optics. Importantly, the mechanical layer 828 can sit atop the key mechanism 311, which can be used to detect key depression in conjunction with a keypad (e.g., keypad 301 described with regard to FIG. 3A). Accordingly, the above examples of FIGS. 8A and 8B illustrate how a touch sensor layer 305 with flexible interconnections and an LED signal layer 824 with flexible interconnections 826 can be used to provide touch sensitivity and backlighting to keys in a keyboard according to examples of the disclosure. In some examples, the inclusion of the flexible interconnections can allow for the depression of individual keys without interfering with the feeling of key depression of the underlying key mechanism 311 and keypad 301.

Figure 9:
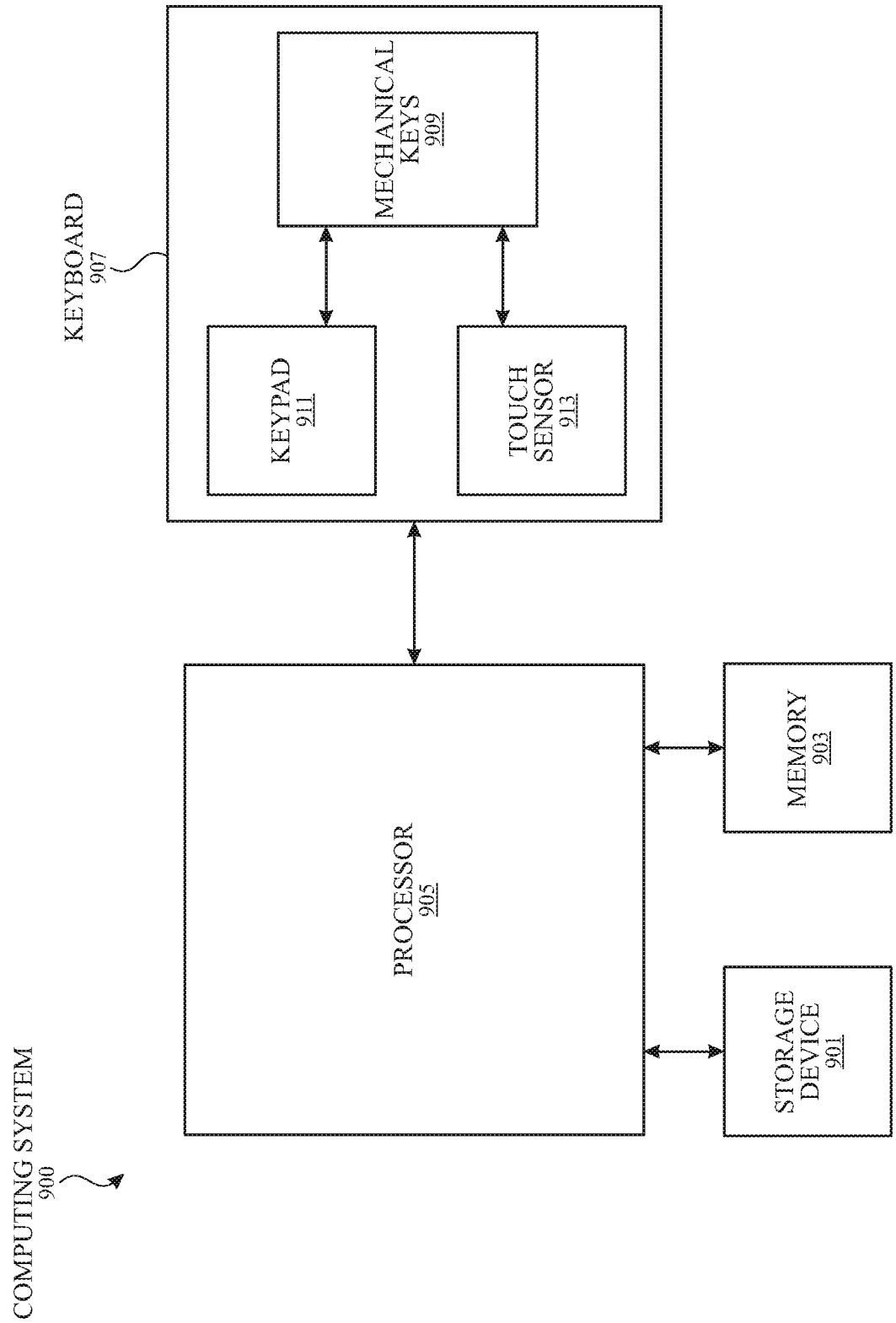
FIG. 9 illustrates an exemplary system including an input device according to various embodiments.

One or more of the functions relating to the detection of a touch event or key depression can be performed by a computing system similar or identical to computing system 900 shown in FIG. 9. Computing system 900 can include instructions stored in a non-transitory computer readable storage medium, such as memory 903 or storage device 901, and executed by processor 905. The instructions can also be stored and/or transported within any non-transitory computer readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer readable storage medium" can be any medium that can contain or store the program for use by or in connection with the instruction execution system, apparatus, or device. The non-transitory computer readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The instructions can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

Computing system 900 can further include touch sensitive mechanical keyboard 907 coupled to processor 905. Touch sensitive mechanical keyboard 907 can be similar or identical to touch sensitive mechanical keyboard 100 or 300 described above. In some examples, keyboard 907 can include mechanical keys 909, keypad 911, and touch sensor 913 for detecting touch events and key depressions and for providing signals indicating a detection of a touch event or key depression to processor 905. In some examples, a touch controller for operating the touch sensor can be included in the keyboard 907 as part of the touch sensor 913. In some examples, the touch controller can send and receive information from the touch sensor electrodes in the touch sensor 913. In some examples, the touch controller can be included in the touch sensor 913, and in some examples, the touch controller can be separate from the touch sensor (e.g., where the touch sensor and touch controller are connected by a touch sensor FPC shown in FIG. 1). In some examples, mechanical keys 909 can be similar or identical to mechanical keys 101, keypad 911 can be similar or identical to keypad 301, and touch sensor 913 can be similar or identical to touch sensor 200 or touch sensor layer 305, described above. Processor 905 can receive the detection signals from keyboard 907 and interpret them as touch events or key depressions.

It is to be understood that the computing system is not limited to the components and configuration of FIG. 9, but can include other or additional components in multiple configurations according to various embodiments. Additionally, the components of computing system 900 can be included within a single device, or can be distributed between two or more devices. For example, while processor 905 is shown separate from keyboard 907, in some embodiments, processor 905 can be located within keyboard 907.

FIG. 10 illustrates an exemplary personal computer 1000 that can include a touch sensitive mechanical keyboard 1101 according to various embodiments.

FIG. 11 illustrates another exemplary personal computer 1100 that can include a touch sensitive mechanical keyboard 1101 according to various embodiments.

The personal computers of FIGS. 10 and 11, as well as other computing devices, can receive both touch input and mechanical key input by utilizing a touch sensitive mechanical keyboard according to various embodiments.

Thus, according to the above, some examples of the disclosure are directed to a touch sensitive keyboard comprising: a touch sensor layer comprising: a plurality of key segments, each key segment of the plurality of key segments include a touch sensor electrode pattern disposed thereon, a plurality of flexible interconnections disposed between adjacent key segments, the plurality of flexible interconnections providing one or more electrical connections between the key segments, and a plurality of key mechanisms, wherein each key mechanism is operatively coupled to a corresponding key segment of the plurality of key segments, the key mechanisms configured to detect depression of a key. Additionally or alternatively to one or more of the examples disclosed above, in some examples, the flexible interconnections comprise a spring-like structure extending in the same plane as the plurality of key segments. Additionally or alternatively to one or more of the examples disclosed above, in some examples, the spring-like structure has a serpentine shape. Additionally or alternatively to one or more of the examples disclosed above, in some examples, the touch sensor layer is transparent, and the touch sensor electrode pattern disposed thereon comprises transparent conductors. Additionally or alternatively to one or more of the examples disclosed above, in some examples, the touch sensor electrode pattern comprises silver nanowire conductors. Additionally or alternatively to one or more of the examples disclosed above, in some examples, the touch sensor electrode pattern comprises carbon nanotube conductors. Additionally or alternatively to one or more of the examples disclosed above, in some examples, the one or more electrical connections provided by the plurality of flexible interconnections are provided by a non-transparent conductor. Additionally or alternatively to one or more of the examples disclosed above, in some examples, the non-transparent conductor is silver ink. Additionally or alternatively to one or more of the examples disclosed above, in some examples, the touch sensor layer comprises an opaque substrate layer. Additionally or alternatively to one or more of the examples disclosed above, in some examples, the keyboard further comprises a backlight layer disposed between the touch sensor layer and the plurality of key mechanisms. Additionally or alternatively to one or more of the examples disclosed above, in some examples, the backlight layer comprises one or more light emitting diodes associated with each key segment of the plurality of key segments, wherein each light emitting is separately addressable to provide backlight to a desired key. Additionally or alternatively to one or more of the examples disclosed above, in some examples, the backlight layer comprises: backlight key segments, each backlight key segment having a corresponding key segment of the plurality of key segments, and a plurality of second flexible interconnections, the plurality of second flexible interconnections disposed between adjacent key segments, the plurality of second flexible interconnections providing one or more electrical connections between the backlight key segments. Additionally or alternatively to one or more of the examples disclosed above, in some examples, the plurality of second flexible interconnections have a buckle shape extending out of the plane of the plurality of backlight key segments. Additionally or alternatively to one or more of the examples disclosed above, in some examples, the touch sensor electrode pattern for each respective key segment of the plurality of key segments comprises: a first plurality of electrodes connected as drive lines disposed along a first direction, and a second plurality of electrodes connected as sense lines disposed along a second direction, orthogonal to the first direction. Additionally or alternatively to one or more of the examples disclosed above, in some examples, a first flexible interconnection connects a first drive line of a first key segment to a second drive line of a second key segment, thereby forming a third drive line comprising the first and second drive lines. Additionally or alternatively to one or more of the examples disclosed above, in some examples, a second flexible interconnection connects a first sense line electrode pattern of a first key segment to a second sense line of a second key segment, thereby forming a third sense line comprising the first and second sense lines. Additionally or alternatively to one or more of the examples disclosed above, in some examples, the keyboard further comprises a second plurality of flexible interconnections, wherein the second plurality of flexible interconnections couple one or more of the plurality of key segments to one or more connection segments. Additionally or alternatively to one or more of the examples disclosed above, in some examples, the one or more connection segments are operatively coupled to a flexible circuit that couples to a touch controller configured to transmit drive signals to and receive sense signals from the touch sensor electrode patterns disposed on the plurality of key segments. Additionally or alternatively to one or more of the examples disclosed above, in some examples, a keycap is coupled to each of the plurality of key segments, each keycap corresponding to a key mechanism of the plurality of key mechanisms, and each key mechanism being separately depressible by contact to the corresponding keycap. Additionally or alternatively to one or more of the examples disclosed above, in some examples, each keycap mechanism comprises a rubber dome and a scissor mechanism or a butterfly mechanism. Although embodiments have been fully described with reference to the accompanying drawings, it is to be noted that various changes and modifications will become apparent to those skilled in the art. Such changes and modifications are to be understood as being included within the scope of the various embodiments as defined by the appended claims.

What is claimed is:

1. A touch sensitive keyboard comprising:
   a touch sensor layer comprising:
      a plurality of key segments, each key segment of the plurality of key segments including a touch sensor electrode pattern of a plurality of touch electrodes disposed thereon;
      a plurality of first flexible interconnections disposed between adjacent key segments, each first flexible interconnection independently flexible with respect to other first flexible interconnections and providing a separate electrical connection between individual touch electrodes in adjacent key segments; and
      a plurality of key mechanisms, wherein each key mechanism is operatively coupled to a corresponding key segment of the plurality of key segments, the key mechanisms configured to detect depression of a key.

2. The touch sensitive keyboard of claim 1, wherein the touch sensor layer comprises an opaque substrate layer.

3. The touch sensitive keyboard of claim 1, wherein a keycap is coupled to each of the plurality of key segments, each keycap corresponding to a key mechanism of the plurality of key mechanisms, and each key mechanism being separately depressible by contact to the corresponding keycap.

4. The touch sensitive keyboard of claim 1, wherein each key mechanism comprises:
   a rubber dome; and
   a scissor mechanism or a butterfly mechanism.

5. The touch sensitive keyboard of claim 1, wherein the plurality of first flexible interconnections comprise spring-like structures extending in the same plane as the plurality of key segments.

6. The touch sensitive keyboard of claim 5, wherein the spring-like structure has a serpentine shape.

7. The touch sensitive keyboard of claim 1, further comprising a plurality of second flexible interconnections, wherein the plurality of second flexible interconnections couple one or more of the plurality of key segments to one or more connection segments.

8. The touch sensitive keyboard of claim 7, wherein the one or more connection segments are operatively coupled to a flexible circuit that couples to a touch controller configured to transmit drive signals to and receive sense signals from the touch sensor electrode patterns disposed on the plurality of key segments.

9. The touch sensitive keyboard of claim 1, further comprising:
   a backlight layer disposed between the touch sensor layer and the plurality of key mechanisms.

10. The touch sensitive keyboard of claim 9, wherein the backlight layer comprises one or more light emitting diodes associated with each key segment of the plurality of key segments, wherein each light emitting is separately addressable to provide backlight to a desired key.

11. The touch sensitive keyboard of claim 9, wherein the backlight layer comprises:
    backlight key segments, each backlight key segment having a corresponding key segment of the plurality of key segments; and
    a plurality of second flexible interconnections, the plurality of second flexible interconnections disposed between adjacent key segments, the plurality of second flexible interconnections providing one or more electrical connections between the backlight key segments.

12. The touch sensitive keyboard of claim 11, wherein the plurality of second flexible interconnections have a buckle shape extending out of the plane of the plurality of backlight key segments.

13. The touch sensitive keyboard of claim 1, wherein the touch sensor layer is transparent, and the touch sensor electrode pattern disposed thereon comprises transparent conductors.

14. The touch sensitive keyboard of claim 13, wherein the touch sensor electrode pattern comprises silver nanowire conductors.

15. The touch sensitive keyboard of claim 13, wherein the touch sensor electrode pattern comprises carbon nanotube conductors.

16. The touch sensitive keyboard of claim 13, wherein the electrical connection provided by each of the plurality of first flexible interconnections is provided by a non-transparent conductor.

17. The touch sensitive keyboard of claim 16, wherein the non-transparent conductor is silver ink.

18. The touch sensitive keyboard of claim 1, wherein the touch sensor electrode pattern for each respective key segment of the plurality of key segments comprises:
    a first plurality of electrodes connected as drive lines disposed along a first direction; and
    a second plurality of electrodes connected as sense lines disposed along a second direction, orthogonal to the first direction.

19. The touch sensitive keyboard of claim 18, wherein at least one of the plurality of first flexible interconnections connects a first drive line of a first key segment to a second drive line of a second key segment, thereby forming a third drive line comprising the first and second drive lines.

20. The touch sensitive keyboard of claim 19, wherein a at least one of the plurality of first flexible interconnections connects a first sense line electrode pattern of a first key segment to a second sense line of a second key segment, thereby forming a third sense line comprising the first and second sense lines.

21. A method for providing touch sensing functionality on a mechanical keyboard, the method comprising:
    forming a plurality of touch sensing electrodes on a surface of each of a plurality of keys on the mechanical keyboard;

electrically connecting together each of a plurality of pairs of the touch sensing electrodes on adjacent keys using an independent first flexible electrical interconnection; and flexing one or more of the independent first flexible electrical interconnections connected to one or more of the touch sensing electrodes on a particular key when that particular key is pressed.

22. The method of claim 21, further comprising forming the independent first flexible electrical interconnections into a spring-like structure.

23. The method of claim 21, further comprising forming drive lines and sense lines from the electrically connected pairs of the touch sensing electrodes.

24. The method of claim 21, further comprising coupling the plurality of keys to one or more connection segments using a plurality of independent second flexible electrical interconnections.

* * * * *